United States Patent
Okazaki (10) Patent No.: US 12,394,609 B2
(45) Date of Patent: Aug. 19, 2025

(54) PRODUCT REMOVAL APPARATUS, TREATMENT SYSTEM, AND PRODUCT REMOVAL METHOD

(71) Applicant: EBARA CORPORATION, Tokyo (JP)

(72) Inventor: Fumiya Okazaki, Tokyo (JP)

(73) Assignee: EBARA CORPORATION, Tokyo (JP)

(*) Notice: Subject to any disclaimer, the term of this patent is extended or adjusted under 35 U.S.C. 154(b) by 302 days.

(21) Appl. No.: 17/935,595

(22) Filed: Sep. 27, 2022

(65) Prior Publication Data
US 2023/0119979 A1    Apr. 20, 2023

(30) Foreign Application Priority Data

Oct. 15, 2021 (JP) ................. 2021-169407

(51) Int. Cl.
*H01J 37/32* (2006.01)
*G01B 21/08* (2006.01)
*G01K 13/00* (2021.01)

(52) U.S. Cl.
CPC ........ *H01J 37/32862* (2013.01); *G01B 21/08* (2013.01); *G01K 13/00* (2013.01); *H01J 37/32449* (2013.01); *H01J 2237/335* (2013.01)

(58) Field of Classification Search
CPC ........... H01J 37/32862; H01J 37/32449; H01J 2237/335; G01B 21/08; G01B 11/0625;
(Continued)

(56) References Cited

U.S. PATENT DOCUMENTS

2005/0081790 A1* 4/2005 Konishi ................ C23C 14/544
118/712
2005/0241761 A1* 11/2005 Kannan ............... C23C 16/4405
156/345.24
(Continued)

FOREIGN PATENT DOCUMENTS

DE    102008030788 A1    12/2009
EP    3421639 A2    1/2019
(Continued)

OTHER PUBLICATIONS

Machine translation of JP 11222680 (Year: 1999).*

*Primary Examiner* — Erin F Bergner
(74) *Attorney, Agent, or Firm* — Chrisman Gallo Tochtrop LLC (57) ABSTRACT

The present disclosure provides a product removal apparatus, a treatment system, and a product removal method that can sufficiently remove the products deposited inside a vacuum pump and also suppress corrosion of the base material of the vacuum pump. The product removal apparatus of the present disclosure includes: a sensor for measuring the temperature of the inside of a vacuum pump, the thickness of a film of a product in a flow path in the vacuum pump, or the vibration frequency of the vacuum pump; a gas supplier for supplying a gas containing hydrogen halide, fluorine, chlorine, chlorine trifluoride, or fluorine radicals to the vacuum pump; and a control device. The control device controls the gas supplier so that the supply of the gas to the vacuum pump is stopped depending on a rate of temperature increase calculated from the temperature measured by the sensor, the film thickness, or the vibration frequency.

13 Claims, 6 Drawing Sheets

(58) Field of Classification Search
CPC ..... G01K 13/00; F04C 23/001; F04C 18/123; F04C 18/16; F04C 2220/30; F04C 2270/12; F04C 2270/19; F04C 2270/80; F04C 18/126; F04C 2280/02; F04C 2280/04; F04C 25/02; Y02C 20/30; C23C 16/4401; C23C 16/4404; C23C 16/4405; C23C 16/4412; F04B 37/14; F04B 49/02; F04B 49/06

See application file for complete search history.

(56) References Cited

U.S. PATENT DOCUMENTS

| | | | | |
|---|---|---|---|---|
| 2007/0093078 | A1* | 4/2007 | Harada | H01L 21/02362 257/E21.273 |
| 2014/0251953 | A1* | 9/2014 | Winkler | H01J 37/32449 134/1.1 |
| 2017/0067152 | A1* | 3/2017 | Hayashi | H01L 21/67017 |
| 2017/0350395 | A1* | 12/2017 | Schofield | C23C 16/4412 |
| 2021/0198786 | A1* | 7/2021 | Hur | H01J 37/32862 |

FOREIGN PATENT DOCUMENTS

| | | |
|---|---|---|
| JP | H09-184075 A | 7/1997 |
| JP | H11-222680 A | 8/1999 |
| JP | 2004-095698 A | 3/2004 |
| JP | 2009-516920 A | 4/2009 |
| JP | 2017-089462 A | 5/2017 |
| JP | 2019-012812 A | 1/2019 |
| JP | 2019-518327 A | 6/2019 |
| WO | 2007/120276 A2 | 10/2007 |
| WO | 2017/189194 A1 | 11/2017 |

* cited by examiner

PRODUCT REMOVAL APPARATUS, TREATMENT SYSTEM, AND PRODUCT REMOVAL METHOD

CROSS-REFERENCE TO RELATED APPLICATION

This application is based upon and claims benefit of priority from Japanese Patent Application No. 2021-169407 filed on Oct. 15, 2021, the entire contents of which are incorporated herein by reference.

TECHNICAL FIELD

The present invention relates to a product removal apparatus, a treatment system, and a product removal method.

BACKGROUND ART

Vacuum pumps are widely used as part of equipment for manufacturing semiconductors, liquid crystals, solar panels, LEDs, and other items. In a process of manufacturing any of these items, a vacuum pump is connected to the chamber of a semiconductor treatment apparatus to intake the process gas in the chamber and create a vacuum environment in the chamber. The process gas used to process a semiconductor may contain a gas producing products. For this reason, when the gas flows from the chamber to the vacuum pump, products may be generated in the flow path in the vacuum pump. If the products are trapped in the gap between the rotors of the vacuum pump, or in the gap between the rotor and the casing that houses the rotor, the products may interfere with the normal rotation of the vacuum pump. There has therefore been a need to remove the products deposited inside the vacuum pump.

A known invention that solves such a problem is the exhaust equipment system disclosed in PTL 1. PTL 1 discloses, as shown in FIG. 1 and other drawings therein, an exhaust equipment system having exhaust equipment for exhausting the gas from the chamber of a manufacturing apparatus, and a gas supplier. The gas supplier is configured to supply gas containing at least one substance selected from the group consisting of hydrogen halide, fluorine, chlorine, chlorine trifluoride, and fluorine radicals to the exhaust equipment. Thus, this exhaust equipment system reacts the products deposited inside the vacuum pump and the like included in the exhaust equipment with the gas containing at least one substance selected from the group consisting of hydrogen halide, fluorine, chlorine, chlorine trifluoride, and fluorine radicals, thereby removing the products.

CITATION LIST

Patent Literature

PTL 1: Japanese Patent Laid-Open No. 2019-12812

SUMMARY OF INVENTION

Technical Problem

By the way, the exhaust equipment system disclosed in PTL 1 does not disclose anything about the amount of the gas, containing at least one substance selected from the group consisting of hydrogen halide, fluorine, chlorine, chlorine trifluoride, and fluorine radicals, that the gas supplier supplies to the exhaust equipment. Hydrogen halide, fluorine, chlorine, chlorine trifluoride, and fluorine radicals remove products deposited in the vacuum pump but may also etch the base material of the vacuum pump. Therefore, if too much hydrogen halide, fluorine, chlorine, chlorine trifluoride, or fluorine radical is supplied to the vacuum pump, the base material of the vacuum pump may be corroded by over-etching, requiring early replacement of the base material. If too little hydrogen halide, fluorine, chlorine, chlorine trifluoride, or fluorine radical is supplied to the vacuum pump, there is a risk that the products deposited in the vacuum pump are not sufficiently removed. In this case, the products may be trapped in the gap between the rotors of the vacuum pump, or in the gap between the rotor and the casing that houses the rotor, and may interfere with the normal rotation of the vacuum pump.

To solve the aforementioned problems, one object of the present invention is to provide a product removal apparatus, a treatment system, and a product removal method that can sufficiently remove the products deposited inside the vacuum pump and also suppress corrosion of the base material of the vacuum pump.

Solution to Problem

A product removal apparatus according to one embodiment includes: a sensor for measuring the temperature of the inside of a vacuum pump, the thickness of a film of a product in a flow path in the vacuum pump, or the vibration frequency of the vacuum pump; a gas supplier for supplying a gas containing hydrogen halide, fluorine, chlorine, chlorine trifluoride, or fluorine radicals to the vacuum pump; and a control device. The control device controls the gas supplier so that the supply of the gas to the vacuum pump is stopped depending on a rate of temperature increase calculated from the temperature measured by the sensor, the film thickness, or the vibration frequency.

A treatment system according to one embodiment includes: a chamber; the vacuum pump; a pipe for connecting the chamber to the vacuum pump; and the product removal apparatus, the apparatus being connected to the pipe.

A product removal method according to one embodiment includes the steps of: supplying a gas containing hydrogen halide, fluorine, chlorine, chlorine trifluoride, or fluorine radicals to a vacuum pump; measuring the temperature inside the vacuum pump, the thickness of a film of a product in the flow path in the vacuum pump, or the vibration frequency of the vacuum pump; and stopping the supply of the gas to the vacuum pump depending on a rate of temperature increase calculated from the temperature, the film thickness, or the vibration frequency.

DESCRIPTION OF EMBODIMENTS

The embodiment of the present invention will be described below with reference to the accompanying drawings. In the drawings described below, identical or equivalent components will be denoted by the same reference numerals and redundant explanations will be omitted.

Figure 1:
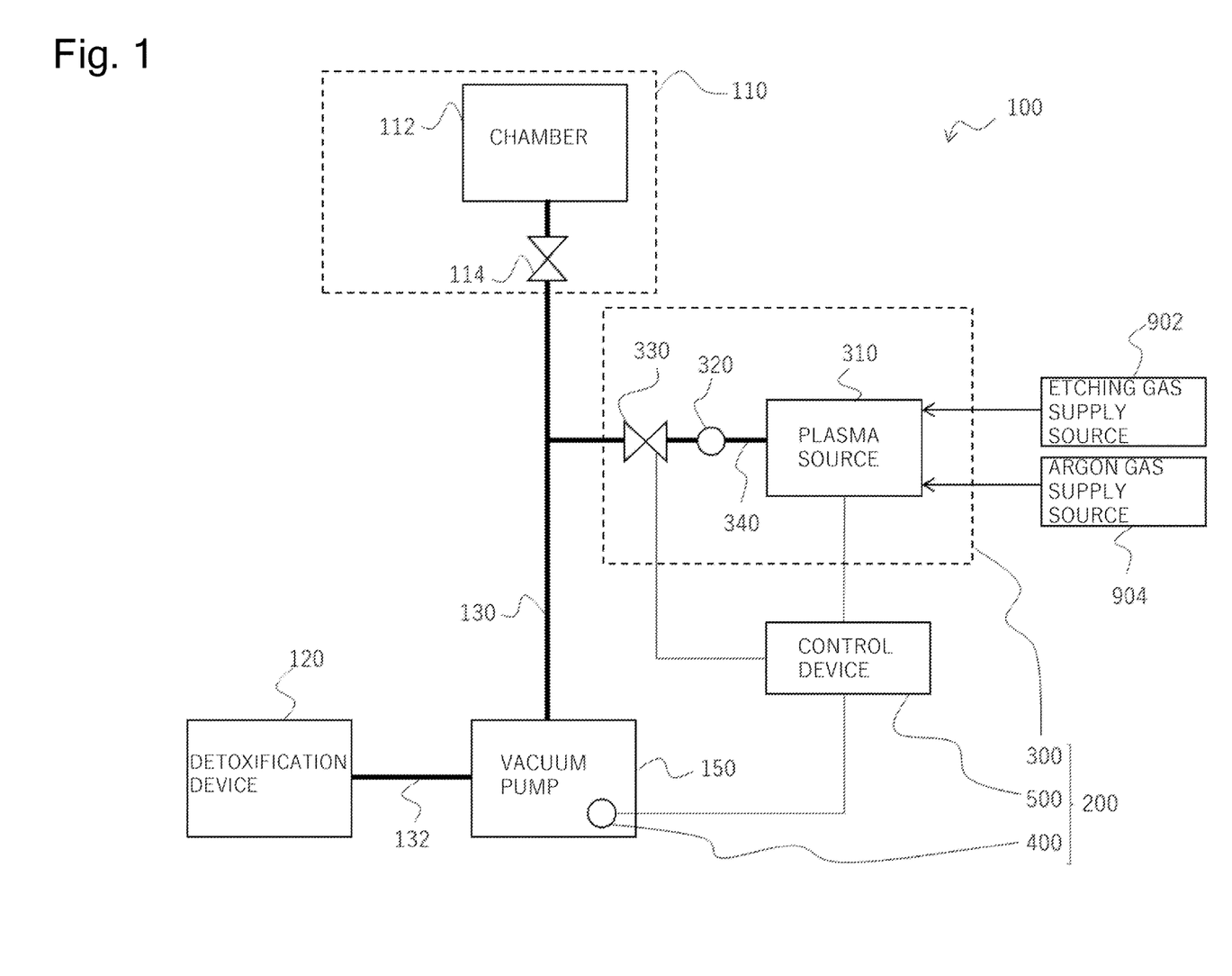
FIG. 1 is a block diagram of a treatment system according to one embodiment of the present disclosure.

FIG. 1 is a block diagram of a treatment system 100 according to an embodiment of the present disclosure. Referring to FIG. 1, the treatment system 100 includes, for example, a semiconductor treatment apparatus 110, a product removal apparatus 200, a detoxification device 120, a vacuum pump 150, and multiple pipes 130 and 132. First, the components of the treatment system 100 will be described.

The semiconductor treatment apparatus 110 includes, for example, a chamber 112 and a valve 114. The semiconductor treatment apparatus 110 is, for example, used to provide a process gas to a substrate placed in the chamber 112 and perform deposition on the substrate. The chamber 112 is connected to the pipe 130. Accordingly, after being used for the deposition, the process gas is exhausted through the pipe 130 to the vacuum pump 150. The valve 114 has the function of adjusting the flow rate of the process gas exhausted from the chamber 112. A semiconductor treatment apparatus herein refers to an apparatus that performs some treatment on a substrate during semiconductor manufacturing. Examples of the semiconductor treatment apparatus include chemical vapor deposition (CVD) apparatuses and atomic layer deposition (ALD) apparatuses.

The vacuum pump 150 intakes the process gas from inside the chamber 112 and is used to create a vacuum in the chamber 112. The vacuum pump 150 is configured to increase the pressure on the intake side during intake from 100 Pa to 300 Pa. The vacuum pump 150 is also connected to the detoxification device 120 through the pipe 132. As a result, the process gas that the vacuum pump 150 intakes from the chamber 112 flows to the detoxification device 120. The detailed structure of the vacuum pump 150 will be described below.

The detoxification device 120 has the function of detoxifying process gases by known methods. The process gas used in semiconductor treatment may include silane gas ($SiH_4$), dichlorosilane gas ($SiH_2Cl_2$), ammonia ($NH_3$), and other toxic flammable gases, or $NF_3$, $ClF_3$, $SF_6$, and $CHF_3$, $C_2F_6$, $CF_4$, and other halogenated persistent gases. Therefore, the process gas exhausted by the vacuum pump 150 cannot be released directly into the air, but is detoxified by the detoxification device 120. The process gas after detoxification is released into the air.

Figure 2:
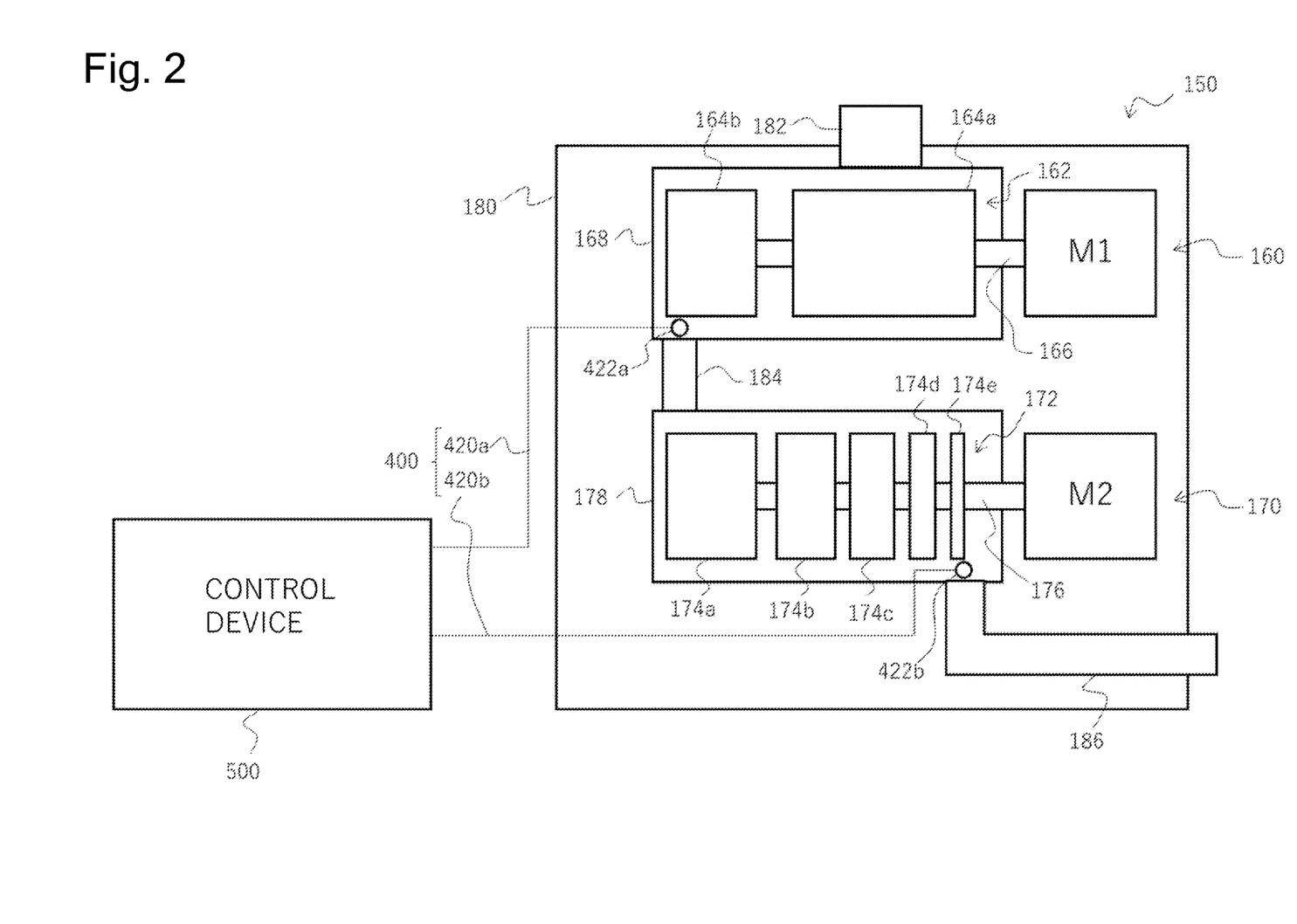
FIG. 2 is a block diagram showing the configuration of the control device and vacuum pump shown in FIG. 1.

The configuration of the vacuum pump 150 will now be described with reference to FIG. 2. FIG. 2 is a block diagram showing the configurations of the control device 500 and vacuum pump 150 shown in FIG. 1. As shown in FIG. 2, the vacuum pump 150 includes, for example, a first vacuum pump 160 as a booster pump, a second vacuum pump 170 as the main pump, a housing 180 for housing the first vacuum pump 160 and second vacuum pump 170, an intake pipe 182, a connection pipe 184, and an exhaust pipe 186.

The first vacuum pump 160 and the second vacuum pump 170 are examples of roots vacuum pump. The first vacuum pump 160 includes a pair of roots pump rotors 162 (FIG. 2 shows only one pump rotor). The second vacuum pump 170 has, for example, a pair of roots pump rotors 172 (FIG. 2 shows only one pump rotor).

An intake pipe 182 is provided at the intake of the first vacuum pump 160, and this intake pipe 182 is connected to the chamber 112 through the pipe 130 (see FIG. 1). An exhaust port is provided downstream from the first vacuum pump 160, and this exhaust port is connected to the intake of the second vacuum pump 170 through the connection pipe 184. The exhaust pipe 186 is connected to the exhaust port of the second vacuum pump 170, and this exhaust pipe 186 is connected to the detoxification device 120 through the pipe 132 (see FIG. 1). Thus, the first vacuum pump 160 and the second vacuum pump 170 are connected in series, and the second vacuum pump 170 is located downstream from the first vacuum pump 160. In other words, the first vacuum pump 160 is located on the vacuum side compared with the second vacuum pump 170 and the second vacuum pump 170 is located on the air side.

As shown in FIG. 2, the first vacuum pump 160 has a pair of opposed multistage pump rotors 162, a motor M1, and a casing 168. Each pump rotor 162 has a first-stage roots rotor (rotor) 164*a* located on the intake side, a second-stage roots rotor (rotor) 164*b* located on the exhaust side, and a rotary shaft 166 to which these roots rotors 164*a* and 164*b* are fixed. The motor M1 is fixed to the end of the rotary shaft 166. The casing 168 houses the roots rotors 164*a* and 164*b*. Additionally, a small gap is formed between the roots rotors 164 and between each roots rotor 164 and the inner surface of the casing 168 in order to make the roots rotor 164 rotatable on a noncontact basis within the casing 168. Rotation of the motor M1 allows the first vacuum pump 160 to intake gas through the intake.

The second vacuum pump 170 differs from the first vacuum pump 160 in that it has a five-stage pump rotor 172. The other configuration of the second vacuum pump 170 is similar to that of the first vacuum pump 160, and their redundant explanations will be omitted. As shown in FIG. 2, the second vacuum pump 170 includes a pair of opposed multistage pump rotors 172, a motor M2, and a casing 178. Each pump rotor 172 has a first-stage roots rotor (rotor) 174*a*, a second-stage roots rotor (rotor) 174*b*, a third-stage roots rotor (rotor) 174*c*, a fourth stage roots rotor (rotor) 174*d*, and a fifth stage roots rotor (rotor) 174*e*, which are located from the intake side to the exhaust side in this order, and a rotary shaft 176 to which these roots rotors are fixed. The motor M2 is fixed to the end of the rotary shaft 176. Additionally, a small gap is formed between the roots rotors 174 and between each roots rotor 174 and the inner surface of the casing 178 in order to make the roots rotor 174 rotatable on a noncontact basis within the casing 178. Rotation of the motor M2 allows the second vacuum pump 170 to intake gas through the intake.

In another embodiment of the present disclosure, the vacuum pump 150 may include screw, claw, or other types of vacuum pumps instead of roots vacuum pumps. Even in this case, a multi-stage pump rotor in which multiple stages of rotors are aligned in the axial direction may be used. The number of stages of pump rotors 162 and 172 should not necessarily be 2 or 5 and may be three or more, or five or more or five or less.

As mentioned above, the intake pipe 182 is connected to the chamber 112 (see FIGS. 1 and 2). As a result, the process gas exhausted from the chamber 112 flows through the flow paths in the first vacuum pump 160 and the flow paths in the second vacuum pump 170. The process gas used in the semiconductor treatment step can contain components that solidify or liquefy as the temperature of the gas decreases. Therefore, when the temperature of the process gas drops as it flows through the flow path in the vacuum pump 150, the process gas may solidify or liquefy, and a product may be deposited in the flow paths in the vacuum pump 150. In other words, this product can be deposited in the gap between the roots rotors 164 and 174 and the gap between each of the roots rotors 164 and 174 and the inner surface of the casings 168 and 178. In such cases, the products can interfere with the rotation of the pump rotors 162 and 174 and cause the motors M1 and M2 to heat up due to excessive load on the motors M1 and M2. There is also a risk that the starting torque of the motors M1 and M2 will not be enough to rotate the pump rotors 162 and 174. For this reason, removal of the products deposited inside the vacuum pump 150 is required. The treatment system 100 includes a product removal apparatus 200 to address this problem. In the present disclosure, "inside the vacuum pump 150" and "in the vacuum pump 150" refer to inside the housing 180 of the vacuum pump 150.

Figure 3:
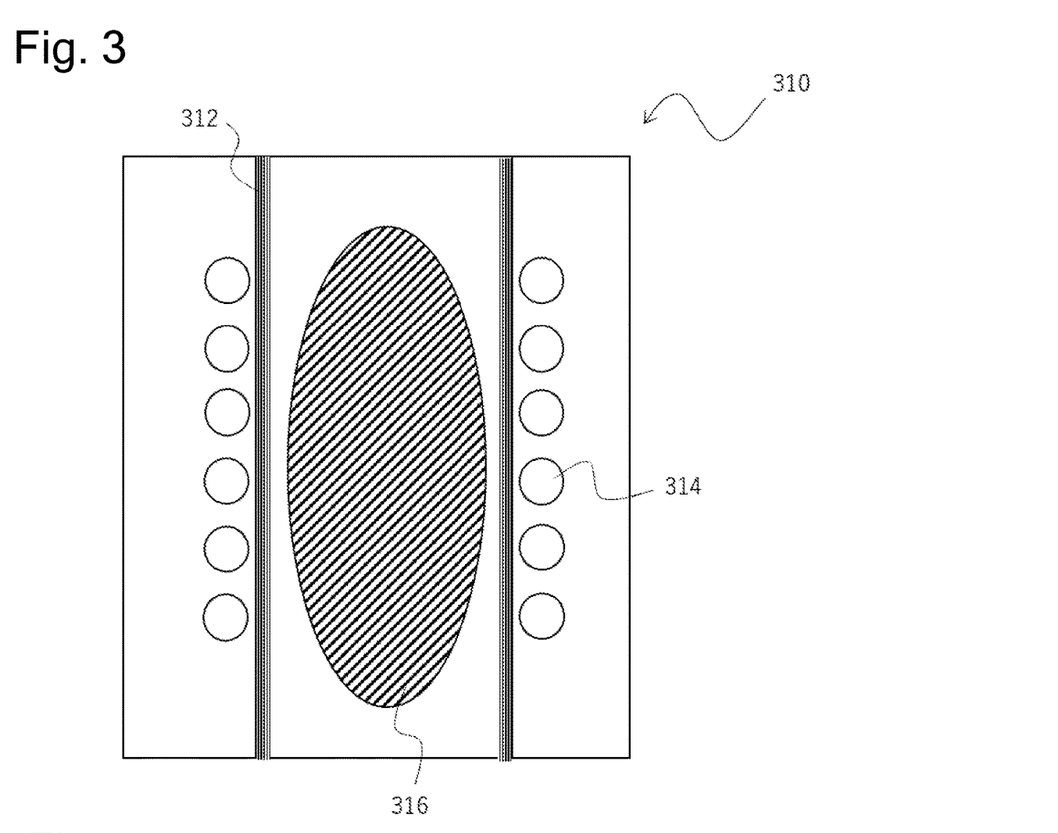
FIG. 3 is a structural diagram showing the configuration of the plasma source shown in FIG. 1.

Referring back to FIG. 1, the product removal apparatus 200 includes a gas supplier 300. The gas supplier 300 includes a plasma source 310 and a pipe 340. Refer now to FIG. 3. FIG. 3 is a structural diagram showing the configuration of the plasma source 310 shown in FIG. 1. Referring to FIG. 3, the plasma source 310 includes a ceramic tube 312 and a coil 314 wound around the ceramic tube 312. The plasma source 310 is configured to generate plasma 316 inside the ceramic tube 312 when a high frequency is applied to the coil 314. Note that the coil 314 is composed of copper (Cu), for example, and the ceramic tube 312 is composed of, for example, at least one material selected from the group consisting of: aluminum nitride (AlN), alumina ($Al_2O_3$), zirconium oxide ($ZrO_2$), hafnium oxide ($HfO_2$), and yttria ($Y_2O_3$).

The plasma source 310 is connected to an etching gas supply source 902 and an argon gas supply source 904 (see FIG. 1). The etching gas supply source 902 is configured to supply etching gas to the plasma source 310. The etching gas contains nitrogen trifluoride ($NF_3$), sulfur hexafluoride ($SF_6$), and carbon tetrafluoride ($CF_4$). Meanwhile, the argon gas supply source 904 is configured to supply argon (Ar) gas to the plasma source 310. The etching gas and argon gas are mixed in the plasma source 310 and a plasma is applied to this mixed gas. Consequently, the plasma source 310 generates fluorine radical gas from the etching gas including nitrogen trifluoride, sulfur hexafluoride, and carbon tetrafluoride. Note that the argon gas is widely used as a gas to ignite the plasma, and is used to ensure the stability of the plasma discharge. The fluorine radical thus generated is supplied to the vacuum pump 150 through the pipes 340 and 130 (see FIG. 1).

As mentioned above, a product may be deposited inside the vacuum pump 150, but the products produced from the process gas is mostly silicon dioxide ($SiO_2$). Silicon dioxide and fluorine radicals react as shown in the following chemical equation. In the chemical equation, one molecule of fluorine radical is expressed as FR.

$$SiO_2 + 4FR \rightarrow SiF_4 + O_2$$

As can be seen from this chemical equation, when silicon dioxide reacts with a fluorine radical, silicon fluoride ($SiF_4$) and oxygen ($O_2$) are generated. Silicon fluoride, which has a low boiling point and sublimates at −95.5° C., is easily removed in gaseous form at room temperature. Accordingly, the fluorine radical supplied to the vacuum pump 150 removes the products deposited inside the vacuum pump 150. In other words, the product removal apparatus 200 has the function of removing the products deposited inside the vacuum pump 150, using fluorine radicals. Although the products can contain tungsten (W)-based products and silicon carbide (SiC), these products can also be removed using fluorine radicals.

Referring again to FIG. 1, the gas supplier 300 has a reducer 320 located downstream from the plasma source 310. The reducer 320 is configured to maintain the pressure inside the plasma source 310 at 10 Torr or higher. If the pressure controlling reducer 320 is not present between the vacuum pump 150 and the plasma source 310, when the vacuum pump 150 intakes gas, the pressure inside the plasma source 310 will be lower than with the reducer 320. If the pressure inside the plasma source 310 drops too much, there is a risk that the plasma source 310 will not generate plasma. In contrast, the gas supplier 300 includes the reducer 320 configured to maintain the pressure inside the plasma source 310 at 10 Torr or higher. As a result, even when the vacuum pump 150 is intaking gas, the plasma source 310 can stably generate plasma 316.

The pipe 340 located downstream from the plasma source 310 is coated with aluminum oxide or insulator. Consequently, fluorine radicals flowing through the pipe 340 are made less prone to deactivation than those flowing through a pipe that is not coated with aluminum oxide or insulator.

The gas supplier 300 also includes a valve 330 attached to the pipe 340. The valve 330 has the function of adjusting the flow rate of the gas flowing through the pipe 340. The valve 330 is used to stop the supply of the gas from the plasma source 310 to the vacuum pump 150. The valve 330 is also used to prevent gas released from chamber 112 from entering the plasma source 310 and to prevent gas from flowing from the plasma source 310 into the vacuum pump 150 in the event of a failure of the vacuum pump 150.

In another embodiment of the present disclosure, the product removal apparatus 200 may include a plasma source that generates fluorine radicals by, instead of using the plasma source 310, generating plasma in another known manner. For example, the plasma source may generate plasma by barrier discharge, creepage discharge, high frequency discharge, or the like to produce fluorine radicals.

Figure 4:
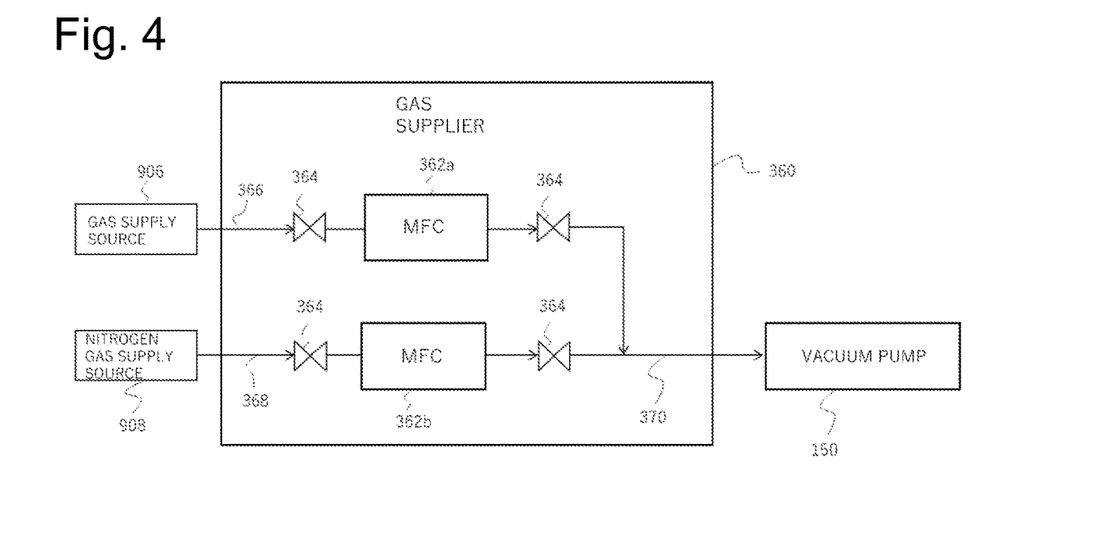
FIG. 4 is a block diagram showing the configuration of a gas supplier according to another embodiment of the present disclosure.

In another embodiment of the present disclosure, the product removal apparatus 200 may include, instead of the gas supplier 300, a gas supplier 360 configured to supply hydrogen halide, fluorine, chlorine, and chlorine trifluoride to the vacuum pump 150. FIG. 4 is a block diagram showing the configuration of the gas supplier 360.

Referring to FIG. 4, the gas supplier 360 includes two mass flow controllers 362a and 362b, valves 364, and a pipe 370. The mass flow controller 362a is connected to a gas supply source 906 via a pipe 366 and has the function of controlling the flow rate of gas supplied from the gas supply source 906. The gas supply source 906 supplies hydrogen halide, fluorine, chlorine, or chlorine trifluoride to the mass flow controller 362a. On the other hand, the mass flow controller 362b is connected to a nitrogen gas supply source 908 and has the function of controlling the flow rate of gas supplied from the nitrogen gas supply source 908 through the pipe 368. The nitrogen gas supply source 908 supplies nitrogen ($N_2$) to the mass flow controller 362b. The valves 364 are used to open and close the pipes. With this configuration, the gas supplier 360 can adjust the concentration of hydrogen halide, fluorine, chlorine, and chlorine trifluoride with nitrogen and supply the concentration-adjusted hydrogen halide, fluorine, chlorine, or chlorine trifluoride to the vacuum pump 150. It is known that hydrogen halide, fluorine, chlorine, and chlorine trifluoride can decompose silicon dioxide contained in the products. For this reason, even if the product removal apparatus 200 includes a gas supplier 360 instead of a gas supplier 300, the product removal apparatus 200 can still remove the product inside the vacuum pump 150.

An example of the configuration of the gas supplier 360 has been described above. However, the gas supplier 360 should not necessarily have the aforementioned configuration as long as it is configured to supply hydrogen halide, fluorine, chlorine, or chlorine trifluoride to the vacuum pump 150. For example, the gas supplier 360 may contain a cylinder filled with hydrogen halide, fluorine, chlorine, or chlorine trifluoride and supply the hydrogen halide, fluorine, chlorine, or chlorine trifluoride in the cylinder to the vacuum pump 150.

As mentioned above, the present disclosure discloses supplying hydrogen halide, fluorine, chlorine, or chlorine trifluoride to the vacuum pump 150 and supplying fluorine radicals to the vacuum pump 150, although it is more preferable to supply fluorine radicals to the vacuum pump 150. Fluorine radicals are more efficient at etching than hydrogen halide, fluorine, chlorine, or chlorine trifluoride and require less volume of gas to remove products. In other words, when the same volume of gas is supplied, fluorine radicals can remove products in a shorter time than hydrogen halide, fluorine, chlorine, or chlorine trifluoride. Upon supply of hydrogen halide, fluorine, chlorine, chlorine trifluoride, or fluorine radicals to the vacuum pump 150, the operation of the semiconductor treatment apparatus 110 is stopped. For this reason, in order to shorten the downtime, it is preferable that fluorine radicals, which are efficient at etching, be supplied to the vacuum pump 150.

As described above, the product removal apparatus 200 according to the present disclosure removes the products deposited in the vacuum pump 150, using hydrogen halide, fluorine, chlorine, chlorine trifluoride, or fluorine radicals. These gases may also etch the base material that constitutes the vacuum pump 150 when removing the products. For this reason, if too much hydrogen halide, fluorine, chlorine, chlorine trifluoride, or fluorine radicals are supplied to the vacuum pump 150, the base material that constitutes the vacuum pump 150 can be corroded by over-etching. Also, if too little hydrogen halide, fluorine, chlorine, chlorine trifluoride, or fluorine radicals are supplied to the vacuum pump 150, there is a risk that the products deposited in the vacuum pump 150 are not sufficiently removed. However, the product removal apparatus 200 has the configuration described below to address such problems, and the treatment system 100 prevents the occurrence of such problems.

Referring again to FIG. 1, the product removal apparatus 200 has a sensor 400 and a control device 500. Referring to FIG. 2, the sensor 400 has, for example, two temperature sensors 420a and 420b for measuring the temperature of the inside of the vacuum pump 150. The temperature sensors 420a and 420b are a thermocouple, for example. Note that the two temperature sensors 420a and 420b may measure the temperature of the gas inside the vacuum pump 150 and determine it as the temperature of the inside of the vacuum pump 150, or measure the temperature of a part of the vacuum pump 150 and determine it as the temperature of the inside of the vacuum pump 150. In particular, the two temperature sensors 420a and 420b preferably measure the temperatures of the casings 168 and 178 and determine it as the temperature of the inside of the vacuum pump 150. The control device 500 is also configured to calculate the rate of temperature increase, from the temperatures measured by the at least one of the temperature sensors 420a and 420b. Furthermore, the control device 500 is configured to control the gas supplier 300 so that the supply of gas to the vacuum pump 150 is stopped when the rate of temperature increase begins to decrease. Note that the rate of temperature increase E is determined, for example, by the following equation.

$E=(T2-T1)/\Delta t$

Here, T1 is a temperature measured at a certain time and T2 is a temperature measured $\Delta t$ seconds after the certain time.

The operation of the product removal apparatus 200 during product removal will now be explained. When the product removal apparatus 200 starts operating, the control device 500 first causes the plasma source 310 to generate fluorine radicals. Next, the control device 500 opens the valve 330. This supplies fluorine radicals to the vacuum pump 150 and removes the products inside the vacuum pump 150. At this time, the control device 500 receives the temperature of the inside of the vacuum pump 150 from the temperature sensors 420a and 420b and calculates the rate of temperature increase. When the rate of temperature increase begins to decrease, the control device 500 controls the valve 330 so that the gas supplier 300 stops the supply of gas to the vacuum pump 150. Note that the control device 500 may send a signal to the plasma source 310 to stop the plasma generation and instruct the plasma source 310 to stop generating plasma, thereby making the gas supplier 300 stop the supply of gas to the vacuum pump 150. This allows the product removal apparatus 200 to suppress corrosion due to over-etching of the vacuum pump 150 while sufficiently removing the products deposited inside the vacuum pump 150. The reasons will be explained below.

The products inside the vacuum pump 150 generate reaction heat as they react with fluorine radicals. For this reason, as the products inside the vacuum pump 150 decrease, the reaction heat decreases and the rate of temperature increase inside the vacuum pump 150 decreases. In particular, when the products inside the vacuum pump 150 are sufficiently removed, the rate of temperature increase inside the vacuum pump 150 decreases. In other words, the amount of products inside the vacuum pump 150 can be estimated from the rate of temperature increase inside the vacuum pump 150.

This means that with a decrease in the rate of temperature increase as a trigger, the control device 500 instructs the gas supplier 300 to stop the supply of gas to the vacuum pump 150, so that the product removal apparatus 200 can suppress corrosion of the vacuum pump 150 due to over-etching while sufficiently removing the products deposited inside the vacuum pump 150.

Figure 5:
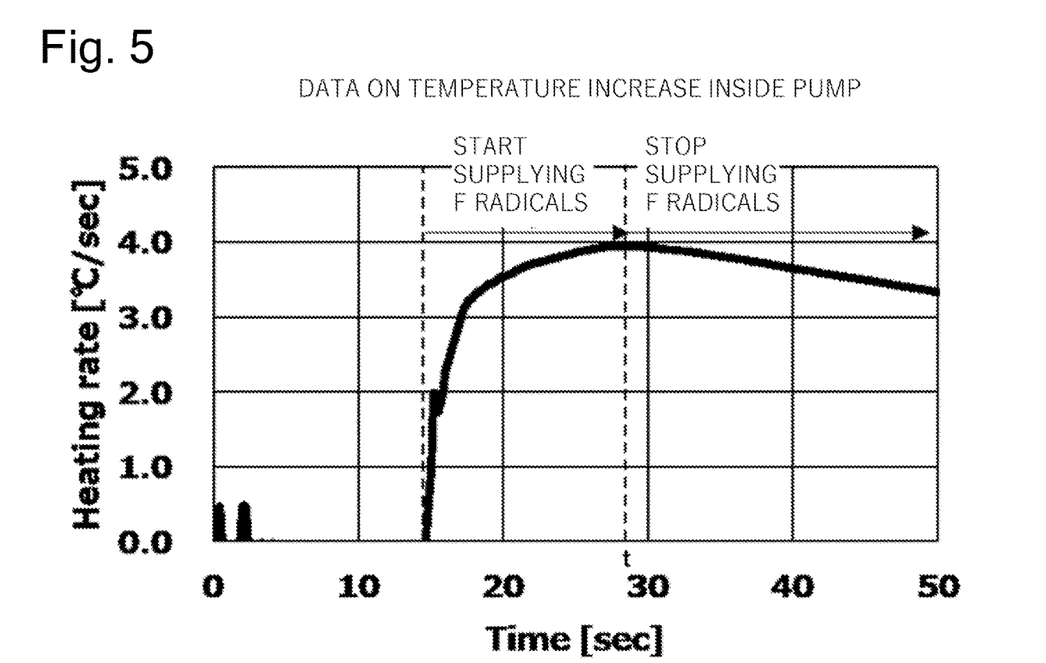
FIG. 5 is a graph showing the relationship between the time and the rate of temperature increase in the vacuum pump during the operation of the product removal apparatus shown in FIG. 1.
Figure 6:
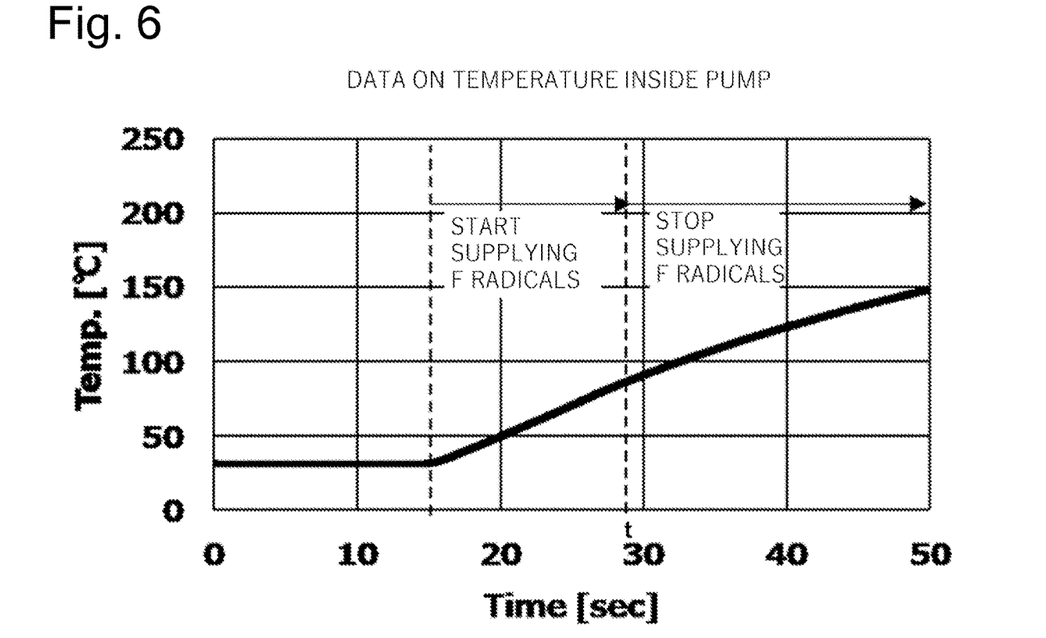
FIG. 6 is a graph showing the relationship between the time and the temperature in the vacuum pump during the operation of the product removal apparatus shown in FIG. 1.

Thus, in the product removal apparatus 200, the control device 500 controls the gas supplier 300 not based on the temperature itself measured by the temperature sensors 420a and 420b but based on the rate of temperature increase calculated from this temperature. The reason for this will be explained below. FIG. 5 is a graph showing the relationship between the time and the rate of temperature increase in the vacuum pump 150 during the operation of the product removal apparatus 200. FIG. 6 is a graph showing the relationship between the time and the temperature in the vacuum pump 150 during the operation of the product removal apparatus 200. Referring to FIG. 5, the rate of temperature increase starts to decrease at the time t. The decrease in the rate of temperature increase at the time t triggers the suspension of the supply of fluorine radicals. FIG. 6 shows that the temperature inside the vacuum pump 150 continues to rise at or after the time t, even though the fluorine radical supply is stopped and no reaction heat is generated. This is because the gas is compressed inside the vacuum pump 150 and compression heat is generated even after the reaction heat is no longer generated. In other words, the temperature inside the vacuum pump 150 depends not only on the reaction heat but also on the compression heat. It is therefore difficult to estimate the amount of product inside the vacuum pump 150 from only the temperature inside the vacuum pump 150 at a certain time. In other words, if suspension of the fluorine radicals is controlled based only on the temperature at a certain time, there is a risk that the products deposited inside the vacuum pump 150 are not sufficiently removed while the corrosion due to over-etching is suppressed. Therefore, the control device 500 controls the gas supplier 300 not based on the temperature itself but based on the rate of temperature increase.

In the examples shown in FIGS. 5 and 6, the rate of temperature increase is a positive value. In other words, the control device 500 stops the supply of fluorine radicals when the rate of temperature increase is a positive value, with a decrease in the rate of temperature increase as a trigger. However, the present disclosure is not limited to this example. In another embodiment of the present disclosure, the control device 500 may trigger a decrease in the rate of temperature increase to stop the supply of fluorine radicals when the rate of temperature increase is a negative value.

Even when the rate of temperature increase starts to decrease, a certain amount of product may remain inside the vacuum pump 150. For this reason, in another embodiment of the present disclosure, the control device 500 may control the gas supplier 300 so that the supply of fluorine radicals to the vacuum pump 150 is stopped when the rate of temperature increase decreases from a predetermined threshold or above to this threshold or below. In other words, the control device 500 may be configured to control the gas supplier 300 so that the supply of fluorine radicals to the vacuum pump 150 is stopped when the rate of temperature increase decreases from a predetermined value or above to the value or below. As the products inside the vacuum pump 150 decrease, the reaction heat decreases and the rate of temperature increase further drops. Accordingly, when the rate of temperature increase decreases from a predetermined value or above to the value or below, it triggers the suspension of the supply of fluorine radicals to the vacuum pump 150, thereby allowing the product removal apparatus 200 to sufficiently remove more products deposited inside the vacuum pump 150.

Although the case where the gas supplier 300 supplies fluorine radicals to the vacuum pump 150 has been described above as an example, even if hydrogen halide, fluorine, chlorine, or chlorine trifluoride is supplied to the vacuum pump 150, the control device 500 performs the same control and thus produces the same effects.

Referring again to FIG. 2, the temperature sensor 420a includes a temperature measuring section 422a. The temperature sensor 420b includes a temperature measuring section 422b. The temperature measuring section 422a is located between the roots rotor 164 and the casing 168 so as not to interfere with the rotation of the roots rotor 164. The temperature measuring section 422b is located between the roots rotor 174 and the casing 178 so as not to interfere with the rotation of the roots rotor 174. This allows the temperature sensors 420a and 420b to measure the temperatures of the gas in the vicinities of the roots rotors 164 and 174, or the temperatures of the casings 168 and 178, respectively.

In another embodiment of the present disclosure, the temperature measuring section 422a of the temperature sensor 420a is located downstream from the downstream roots rotor 164b and measures the temperature of the gas at this location. The temperature measuring section 422b of the temperature sensor 420b is located downstream from the most downstream roots rotor 174e and measures the temperature of the gas at this location. This allows the product removal apparatus 200 to stop the supply of fluorine radicals to the vacuum pump 150 based on the rate of temperature increase obtained downstream from the roots rotor 164b or roots rotor 174e. The temperature obtained downstream from a rotor is greatly affected by the heat of reaction between the products deposited on the rotor and fluorine radicals. This is because the gas immediately after being heated by the reaction heat between the fluorine radicals and the products deposited on the rotor flows downstream from the rotor and greatly affects the temperature obtained downstream from the rotor. Thus, the amount of products deposited on the rotor can be estimated from the temperature obtained downstream from the rotor. In other words, the product removal apparatus 200 can sufficiently remove especially the products deposited on the roots rotors 164b and 164e while suppressing corrosion due to over-etching of the roots rotors 164b and 164e. This ensures avoidance of the problem that the products are deposited in small gaps between the roots rotors 164 and 174 and between each of the roots rotors 164 and 174 and the inner surface of the casings 168 and 178 and interfere with the rotation of the pump rotors 162 and 174. In another embodiment of the present disclosure, the temperature measuring section 422a may be located downstream from the roots rotor 164a, and the temperature measuring section 422b may be located downstream from the roots rotors 174a, 174b, 174c, and 174d. In yet another embodiment of the present disclosure, the temperature measuring sections 422a and 422b may be located at any point inside the housing 180 of the vacuum pump 150.

Figure 7:
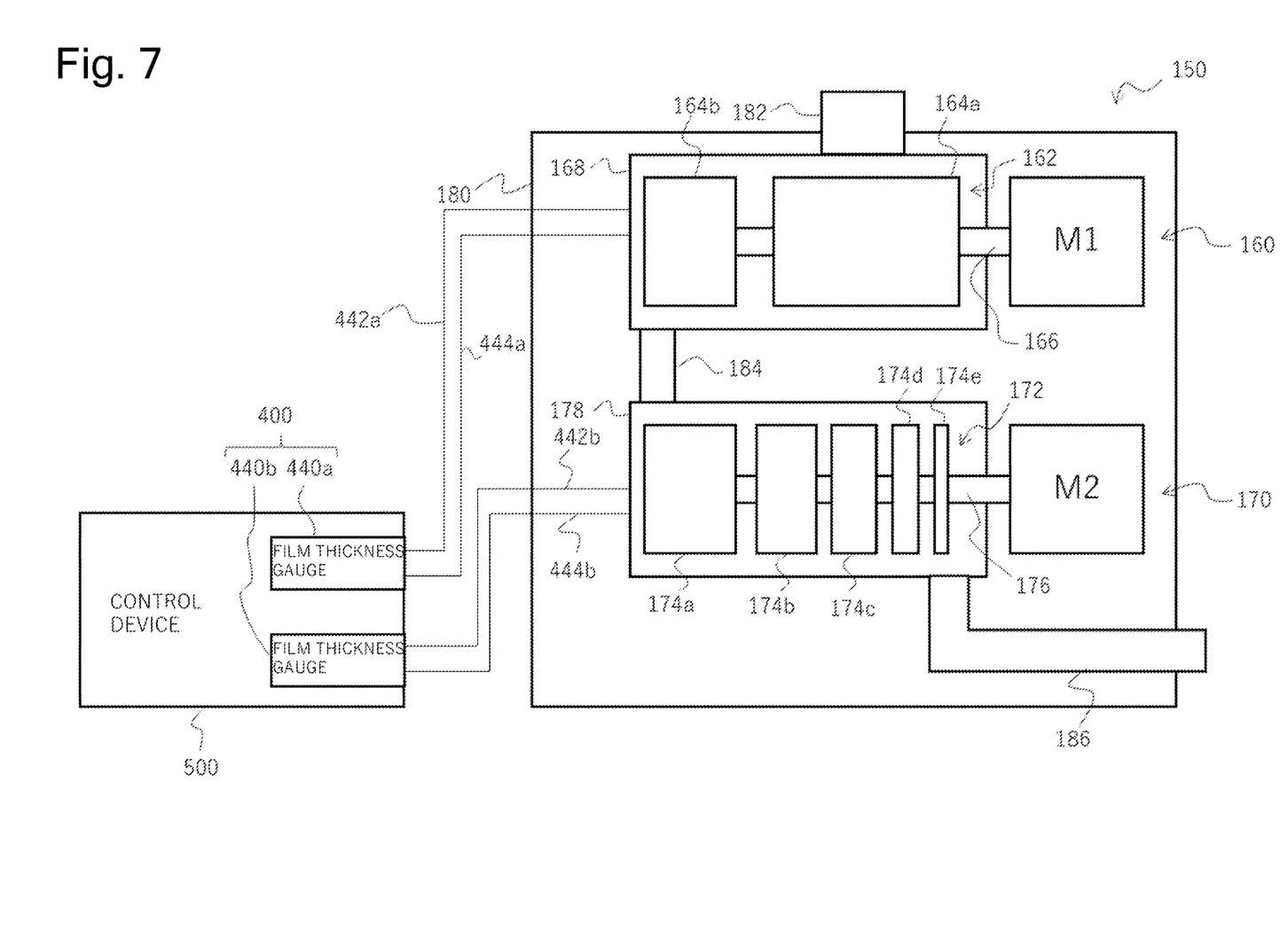
FIG. 7 is a block diagram showing the configuration of the control device and vacuum pump according to another embodiment of the present disclosure.

In another embodiment of the present disclosure, the sensor 400 may include optical film thickness gauges (film thickness gauges) 440a and 440b for measuring product film thickness of the products. FIG. 7 is a block diagram showing the configurations of the control device 500 in which the sensor 400 includes two optical film thickness gauges 440a and 440b, and the vacuum pump 150. Referring to FIG. 7, the two optical film thickness gauges 440a and 440b include incident optical fibers 442a and 442b and light-receiving fibers 444a and 444b, respectively. The light-receiving fibers 444a and 444b are configured to be able to receive reflected light from the light emitted by the incident optical fibers 442a and 442b, respectively. The optical film thickness gauges 440a and 440b are configured to determine product film thicknesses based on the reflected light received by the light-receiving fibers 444a and 444b in a known manner. In this way, the optical film thickness gauge 440 can measure the film thickness of the products in the vacuum pump 150.

The optical film thickness gauges 440a and 440b may be configured to measure the thickness of the products at any location in the flow path within the vacuum pump 150. However, the optical film thickness gauges 440a and 440b are preferably configured to measure the film thickness of the products deposited in the intake pipe 182 or casings 168 and 178. The optical film thickness gauges 440a and 440b generally offer higher measurement accuracy when determining the film thickness from light incident and reflected perpendicularly to the measurement plane than when determining the film thickness from light incident and reflected in other directions. The intake pipe 182 and casings 168 and 178 are stationary. The intake pipe 182 and casings 168 and 178 also have a space wide enough to place the incident optical fibers 442a and 442b and light-receiving fibers 444a and 444b. Consequently, the incident optical fibers 442a and 442b and the light-receiving fibers 444a and 444b can be placed inside the intake pipe 182 or casings 168 and 178 so that the light-receiving fibers 444a and 444b can receive light incident and reflected perpendicularly to the measurement plane. For this reason, the optical film thickness gauges 440a and 440b are preferably configured as described above.

In the embodiment related to FIG. 7, the control device 500 is configured to control the gas supplier 300 so that the supply of fluorine radicals to the vacuum pump 150 is stopped when the product film thickness measured with at least one of the optical film thickness gauges 440a and 440b falls to or below a predetermined thickness. In other words, when the product film thickness in the vacuum pump 150 falls to or below the predetermined thickness, the supply of fluorine radicals to the vacuum pump 150 is stopped. This suppresses corrosion of the vacuum pump 150 due to over-etching.

Figure 8:
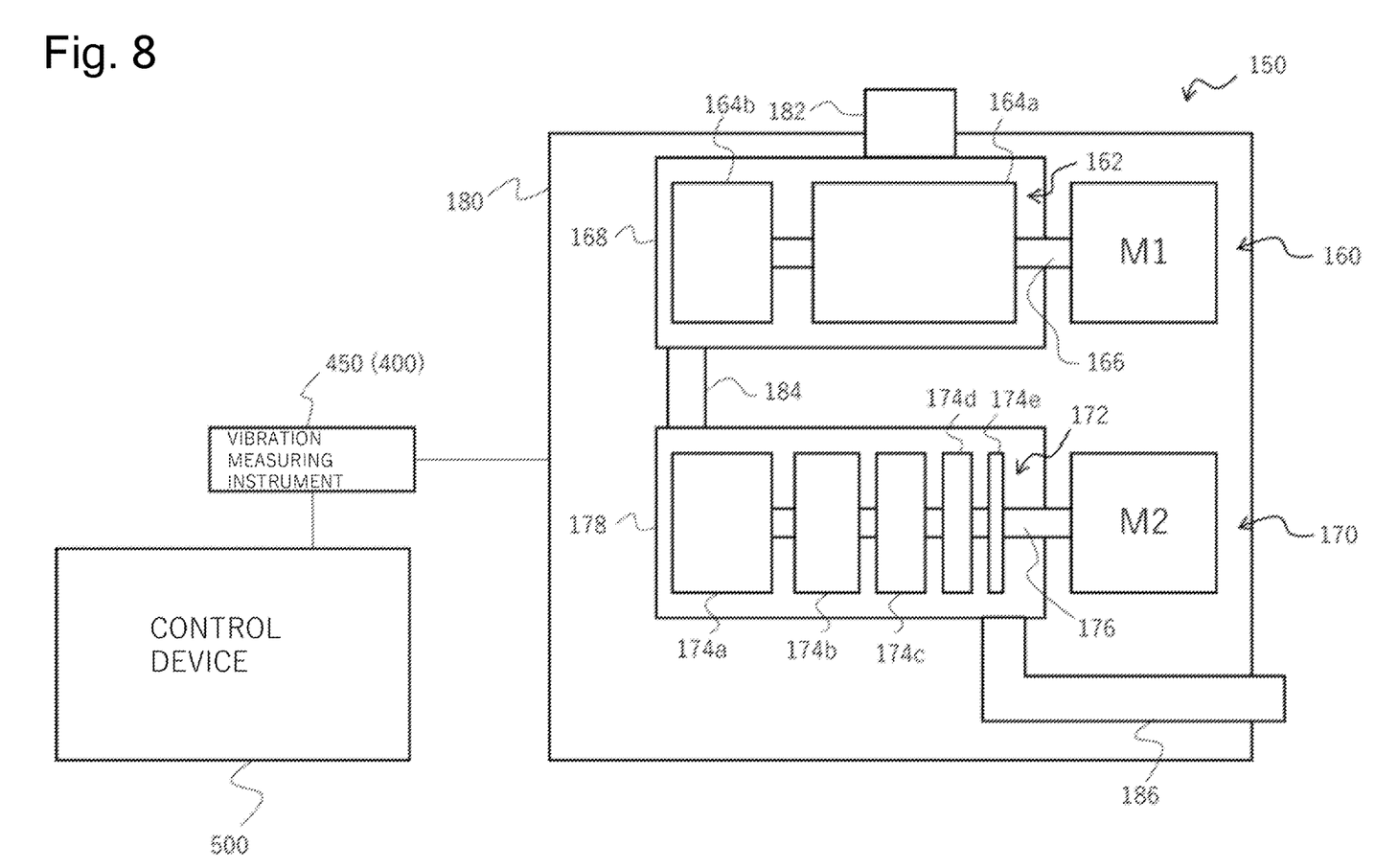
FIG. 8 is a block diagram showing the configuration of the control device and vacuum pump according to another embodiment of the present disclosure.

In another embodiment of the present disclosure, as shown in FIG. 8, the sensor 400 may include a vibration measuring instrument 450 for measuring the vibration frequency of the vacuum pump 150. In this case, the control device 500 is configured to control the gas supplier 300 so that the supply of fluorine radicals to the vacuum pump 150 is stopped when the vibration frequency measured with the vibration measuring instrument 450 falls within a predetermined range. Such control by the control device 500 suppresses corrosion of the vacuum pump 150 due to over-etching. The reason will be explained below.

When there is no products deposited inside the vacuum pump 150, the vacuum pump 150 vibrates stably at a substantially constant frequency. In other words, the vibration frequency of the vacuum pump 150 is within a certain predetermined range. In contrast, if products are deposited inside the vacuum pump 150, the products deposited on parts cause friction between the parts during the rotation of the roots rotors 164 and 174. This causes the vacuum pump 150 to vibrate at a different frequency than it would if there were no products deposits thereinside. In particular, the frequency of vibration of the vacuum pump 150 is outside the predetermined range described above. In other words, when the frequency of vibration of the vacuum pump 150 is within the predetermined range, there are little products inside the vacuum pump 150 and when the frequency of vibration of the vacuum pump 150 is outside the predetermined range, there are much products inside the vacuum pump 150. In the embodiment related to FIG. 8, when the vibration frequency measured by the vibration measuring instrument 450 falls within the predetermined range, the supply of fluorine radicals to the vacuum pump 150 is stopped. This suppresses corrosion of the vacuum pump 150 due to over-etching. For example, the predetermined range may be from +5% to −5% of the vibration frequency when no products is deposited.

Note that the vibration measuring instrument 450 may be configured to measure vibrations at any location in the vacuum pump 150. For example, the vibration measuring instrument 450 may measure the vibrations of the housing 180, motor M1, and motor M2.

As mentioned above, in the embodiment related to FIG. 2, the sensor 400 includes temperature sensors 420a and 420b. In the embodiment related to FIG. 7, the sensor 400 includes optical film thickness gauges 440a and 440b. In the embodiment related to FIG. 8, the sensor 400 includes a vibration measuring instrument 450. In other words, these disclose examples where the sensor 400 includes a sensor based on a single method. However, the present disclosure should not necessarily be like in these examples. In another embodiment of the present disclosure, the sensor 400 may selectively include temperature sensors 420a and 420b, optical film thickness gauges 440a and 440b, and a vibration measuring instrument 450, in combination, as needed.

APPENDICES

Some or all of the aforementioned embodiments may also be described as, but not limited to, the following notes.

Appendix 1

A product removal apparatus according to Appendix 1 includes: a sensor for measuring the temperature of the inside of a vacuum pump, the thickness of a film of a product in a flow path in the vacuum pump, or the vibration frequency of the vacuum pump; a gas supplier for supplying a gas containing hydrogen halide, fluorine, chlorine, chlorine trifluoride, or fluorine radicals to the vacuum pump; and a control device. The control device controls the gas supplier so that the supply of the gas to the vacuum pump is stopped depending on a rate of temperature increase calculated from the temperature measured by the sensor, the film thickness, or the vibration frequency.

Silicon dioxide ($SiO_2$) or silicon carbide (SiC) may be deposited inside the vacuum pump connected to the semiconductor treatment apparatus. The product removal apparatus according to Appendix 1 can supply hydrogen halide, fluorine, chlorine, chlorine trifluoride, or fluorine radicals to the vacuum pump, and react the products with hydrogen halide, fluorine, chlorine trifluoride, or fluorine radicals, thereby removing the products inside the vacuum pump.

The products inside the vacuum pump react with hydrogen halide, fluorine, chlorine, chlorine trifluoride, or fluorine radicals, which generates reaction heat. Therefore, as the products inside the vacuum pump decrease, the reaction heat decreases and the rate of temperature increase inside the vacuum pump decreases. In other words, the amount of products inside the vacuum pump can be estimated from the rate of temperature increase inside the vacuum pump.

If products are deposited in the vacuum pump, the products deposited on parts cause friction between the parts during the rotation of the rotors. This inhibits the rotation of the rotors and changes the vibration frequency of the vacuum pump. On the other hand, if the products are removed from the vacuum pump, the friction is eliminated and the vibration frequency of the vacuum pump reverts to its default value (the vibration frequency value obtained when no product is deposited in the vacuum pump). Therefore, the amount of products in the vacuum pump can be estimated from the vibration frequency of the vacuum pump.

The product removal apparatus according to Appendix 1 is configured to stop the supply of gas containing hydrogen halide, fluorine, chlorine, chlorine trifluoride, or fluorine radicals to the vacuum pump depending on the temperature inside the vacuum pump, the product film thickness in the flow path inside the vacuum pump, or the vibration frequency of the vacuum pump. In other words, the product removal apparatus can stop providing gas containing hydrogen halide, fluorine, chlorine, chlorine trifluoride, or fluorine radicals to the vacuum pump depending on the directly measured product film thickness or estimated amount of products. As a result, the hydrogen halide, fluorine, chlorine, chlorine trifluoride, or fluorine radicals are prevented from over-etching the vacuum pump. In other words, this product removal apparatus can sufficiently remove the product deposited inside the vacuum pump while suppressing corrosion due to over-etching of the vacuum pump.

Appendix 2

In the product removal apparatus according to Appendix 2, in relation to the product removal apparatus of Appendix 1, the sensor includes a temperature sensor for measuring the temperature of the inside of the vacuum pump, and the control device calculates the rate of temperature increase from the temperature measured by the sensor, and controls the gas supplier so that the supply of the gas to the vacuum pump is stopped when the rate of temperature increase starts to decrease or when the rate of temperature increase decreases from a predetermined rate of temperature increase or above to the predetermined rate of temperature increase or below.

Once the products in the vacuum pump are sufficiently removed and the reaction between the products and hydrogen halide, fluorine, chlorine, chlorine trifluoride, or fluorine radicals is completed, the generation of reaction heat disappears. This decreases the energy used to raise the temperature in the vacuum pump. As a result, the rate of temperature increase decreases. The product removal apparatus according to Appendix 2 stops supplying hydrogen halide, fluorine, chlorine, chlorine trifluoride, or fluorine radicals to the vacuum pump when the rate of temperature increase starts to decrease or when the rate of temperature increase decreases from a predetermined rate of temperature increase or above to the predetermined rate of temperature increase or below. In other words, in this product removal apparatus, the supply of hydrogen halide, fluorine, chlorine, chlorine trifluoride, or fluorine radicals to the vacuum pump is stopped when the products in the vacuum pump have been sufficiently removed. This means that this product removal apparatus can suppress corrosion of the vacuum pump due to over-etching.

Appendix 3

In the product removal apparatus according to Appendix 3, in relation to the product removal apparatus of Appendix 2, the temperature sensor includes a temperature measuring section to be located downstream from a rotor of the vacuum pump.

The temperature obtained downstream from a rotor is affected by the heat of reaction between the products deposited on the rotor and hydrogen halide, fluorine, chlorine, chlorine trifluoride, or fluorine radicals. Therefore, the amount of products deposited on the rotor can be estimated from the temperature obtained downstream from the rotor. The product removal apparatus according to Appendix 3 also stops the supply of hydrogen halide, fluorine, chlorine, chlorine trifluoride, or fluorine radicals to the vacuum pump depending on the downstream side from the rotor. Consequently, this product removal apparatus can sufficiently remove the products deposited on the rotors while suppressing especially corrosion of the rotors of the vacuum pump due to over-etching.

Appendix 4

In the product removal apparatus according to Appendix 4, in relation to any one of the product removal apparatuses of Appendices 1 to 3, the sensor includes a film thickness gauge for measuring the thickness of a film of a product in the flow path in the vacuum pump. The control device controls the gas supplier so that the supply of the gas to the vacuum pump is stopped when the film thickness measured by the film thickness gauge falls to or below a predetermined thickness.

The product removal apparatus according to Appendix 4 stops supplying hydrogen halide, fluorine, chlorine, chlorine trifluoride, or fluorine radicals to the vacuum pump when the thickness of the product film in the vacuum pump falls to or below the predetermined thickness. This means that this product removal apparatus can suppress corrosion of the vacuum pump due to over-etching.

Appendix 5

In the product removal apparatus according to Appendix 5, in relation to the product removal apparatus of Appendix 4, the film thickness gauge is an optical film thickness gauge, and the optical film thickness gauge comprises an incident optical fiber for emitting light and a light-receiving fiber for receiving reflected light resulting from the light being reflected, and is configured to determine the film thickness from the reflected light received by the light-receiving fiber.

The product removal apparatus according to Appendix 5 can measure the thickness of the product film in the vacuum pump by using light.

Appendix 6

In the product removal apparatus according to Appendix 6, in relation to any one of the product removal apparatuses of Appendices 1 to 5, the sensor includes a vibration measuring instrument for measuring the vibration frequency of the vacuum pump, and the control device controls the gas supplier so that the supply of the gas to the vacuum pump is stopped when the vibration frequency measured by the vibration measuring instrument falls within a predetermined range.

The product removal apparatus according to Appendix 6 stops supplying hydrogen halide, fluorine, chlorine, chlorine trifluoride, or fluorine radicals to the vacuum pump when the vibration frequency of the vacuum pump falls within a predetermined range. As described above, when the products are removed from the vacuum pump, the friction is eliminated and the vibration frequency of the vacuum pump reverts to its default value. As a result, the frequency of the vacuum pump falls within a predetermined range. Accordingly, in this product removal apparatus, when the amount of products decreases, hydrogen halide, fluorine, chlorine, chlorine trifluoride, or fluorine radicals are not supplied to the vacuum pump. In other words, this product removal apparatus can suppress corrosion of the vacuum pump due to over-etching.

Appendix 7

In the product removal apparatus according to Appendix 7, in relation to any one of the product removal apparatuses of Appendices 1 to 6, the gas supplier includes a valve for adjusting the flow rate of the gas supplied to the vacuum pump, and the control device controls the valve to stop the supply of the gas to the vacuum pump.

The product removal apparatus according to Appendix 7 can stop the supply of the gas to the vacuum pump by the controller controlling a valve.

Appendix 8

In the product removal apparatus according to Appendix 8, in relation to any one of the product removal apparatuses of Appendices 1 to 7, the gas supplier includes a plasma source for generating the fluorine radicals.

In the product removal apparatus according to Appendix 8, the plasma source can generate fluorine radicals.

Appendix 9

In the product removal apparatus according to Appendix 9, in relation to the product removal apparatus of Appendix 8, the plasma source is configured to generate the fluorine radicals from nitrogen trifluoride, sulfur hexafluoride, or carbon tetrafluoride.

In the product removal apparatus according to Appendix 9, the plasma source can generate fluorine radicals from nitrogen trifluoride, sulfur hexafluoride, or carbon tetrafluoride.

Appendix 10

In the product removal apparatus according to Appendix 10, in relation to the product removal apparatus of Appendix 8 or 9, the gas supplier includes a reducer located downstream from the plasma source and configured to maintain the pressure inside the plasma source at 10 Torr or higher.

If there is no pressure-controlling reducer between the vacuum pump and the plasma source, the pressure inside the plasma source will be lower when the vacuum pump intakes gas than with such a reducer. If the pressure inside the plasma source drops too much, there is a risk that the plasma source will not be able to generate plasma. The product removal apparatus according to Appendix 10 includes a reducer configured to maintain the pressure inside the plasma source at 10 Torr or higher. This allows the plasma source to stably generate plasma even while the vacuum pump is intaking gas.

Appendix 11

In the product removal apparatus according to Appendix 11, in relation to any one of the product removal apparatuses of Appendices 8 to 10, the gas supplier is located downstream from the plasma source and comprises a pipe coated with aluminum oxide or insulator.

According to the product removal apparatus according to Appendix 11, the pipe that carries fluorine radicals is coated with aluminum oxide or insulator. Consequently, the fluorine radicals are made less prone to deactivation than those flowing through a pipe that is not coated with aluminum oxide or insulator.

Appendix 12

A treatment system according to Appendix 12 includes: a chamber; the vacuum pump; a pipe for connecting the chamber to the vacuum pump; and the product removal apparatus according to any one of Appendices 1 to 11, the apparatus being connected to the pipe.

Similarly to the product removal apparatus according to Appendix 1, the treatment system according to Appendix 12 can sufficiently remove the products deposited inside the vacuum pump while suppressing corrosion due to over-etching of the vacuum pump.

Appendix 13

The treatment system according to Appendix 13, in relation to the treatment system of Appendix 12, further includes a detoxification device located downstream from the vacuum pump.

The treatment system according to Appendix 13 can use a detoxification device to detoxify the gas supplied from the vacuum pump to the detoxification device.

Appendix 14

A product removal method according to Appendix 14 includes the steps of: supplying a gas containing hydrogen halide, fluorine, chlorine, chlorine trifluoride, or fluorine radicals to a vacuum pump; measuring the temperature inside the vacuum pump, the thickness of a film of a product in the flow path in the vacuum pump, or the vibration frequency of the vacuum pump; and stopping the supply of the gas to the vacuum pump depending on a rate of temperature increase calculated from the temperature, the film thickness, or the vibration frequency.

Similarly to the product removal apparatus according to Appendix 1, the product removal method according to Appendix 14 can sufficiently remove the products deposited in the flow paths in the vacuum pump while suppressing corrosion of the vacuum pump due to over-etching.

The embodiments of the present invention and the related modifications, which have been described above, are intended to facilitate understanding of the present invention, and needless to say, not intended to limit the present invention. The present invention may be modified and improved as appropriate without departing from its scope, and the equivalents are included in the present invention. Also, as long as at least some of the aforementioned problems can be solved or at least some of the aforementioned advantageous effects can be achieved, the components described in the claims and herein can be selectively used in combination or omitted.

REFERENCE SIGNS LIST

100: Treatment system
110: Semiconductor treatment apparatus
112: Chamber
120: Detoxification device
150: Vacuum pump
160: First vacuum pump
164: Roots rotor
170: Second vacuum pump
174: Roots rotor
200: Product removal apparatus
300: Gas supplier
310: Plasma source
320: Reducer
330: Valve
340: Pipe
360: Gas supplier
400: Sensor 420a, 420b: Temperature sensor
422a, 422b: Temperature measuring section
440a, 440b: Optical film thickness gauge
442a, 442b: Incident optical fiber
444a, 444b: Light-receiving fibers
450: Vibration measuring instrument
500: Control device

What is claimed is:

1. A product removal apparatus comprising:
a vacuum pump;
a sensor for measuring the temperature of the inside of the vacuum pump, the thickness of a film of a product in a flow path in the vacuum pump, or the vibration frequency of the vacuum pump;
a gas supplier for supplying a gas containing hydrogen halide, fluorine, chlorine, chlorine trifluoride, or fluorine radicals to the vacuum pump; and
a control device, wherein
the control device controls the gas supplier so that the supply of the gas to the vacuum pump is stopped depending on a rate of temperature increase calculated by the control device from the temperature measured by the sensor, the film thickness, or the vibration frequency,
the sensor comprises a temperature sensor for measuring the temperature of the inside of the vacuum pump, and
the control device calculates the rate of temperature increase from the temperature measured by the sensor, and controls the gas supplier so that the supply of the gas to the vacuum pump is stopped when the rate of temperature increase starts to decrease.

2. The product removal apparatus according to claim 1, wherein the temperature sensor comprises a temperature measuring section to be located downstream from a rotor of the vacuum pump.

3. The product removal apparatus according to claim 1, wherein
the sensor includes a film thickness gauge for measuring the thickness of a film of a product in the flow path in the vacuum pump, and
the control device controls the gas supplier so that the supply of the gas to the vacuum pump is stopped when the film thickness measured by the film thickness gauge falls to or below a predetermined thickness.

4. The product removal apparatus according to claim 3, wherein
the film thickness gauge is an optical film thickness gauge, and
the optical film thickness gauge comprises an incident optical fiber for emitting light and a light-receiving fiber for receiving reflected light resulting from the light being reflected, and is configured to determine the film thickness from the reflected light received by the light-receiving fiber.

5. The product removal apparatus according to claim 1, wherein
the sensor comprises a vibration measuring instrument for measuring the vibration frequency of the vacuum pump, and
the control device controls the gas supplier so that the supply of the gas to the vacuum pump is stopped when the vibration frequency measured by the vibration measuring instrument falls within a predetermined range.

6. The product removal apparatus according to claim 1, wherein
the gas supplier comprises a valve for adjusting the flow rate of the gas supplied to the vacuum pump, and
the control device controls the valve to stop the supply of the gas to the vacuum pump.

7. The product removal apparatus according to claim 1, wherein the gas supplier comprises a plasma source for generating the fluorine radicals.

8. The product removal apparatus according to claim 7, wherein the plasma source is configured to generate the fluorine radicals from nitrogen trifluoride, sulfur hexafluoride, or carbon tetrafluoride.

9. The product removal apparatus according to claim 7, wherein the gas supplier comprises a reducer located downstream from the plasma source and configured to maintain the pressure inside the plasma source at 10 Torr or higher.

10. The product removal apparatus according to any one of claim 7, wherein the gas supplier is located downstream from the plasma source and comprises a pipe coated with aluminum oxide or insulator.

11. A treatment system comprising:
the product removal apparatus according to claim 1;
a chamber;
a pipe for connecting the chamber to the vacuum pump; and
the apparatus being connected to the pipe.

12. The treatment system according to claim 11, further comprising a detoxification device located downstream from the vacuum pump.

13. A product removal method comprising the steps of:
providing the product removal apparatus of claim 1;
supplying a gas containing hydrogen halide, fluorine, chlorine, chlorine trifluoride, or fluorine radicals to the vacuum pump;
measuring the temperature inside the vacuum pump, the thickness of a film of a product in the flow path in the vacuum pump, or the vibration frequency of the vacuum pump; and
stopping the supply of the gas to the vacuum pump depending on a rate of temperature increase calculated from the temperature, the film thickness, or the vibration frequency.

* * * * *